(12) United States Patent
Cornic et al.

(10) Patent No.: US 10,386,397 B2
(45) Date of Patent: Aug. 20, 2019

(54) METHOD FOR DETECTING SIGNALS IN A FREQUENCY-AMBIGUOUS DIGITAL RECEIVER, AND DIGITAL RECEIVER IMPLEMENTING SUCH A METHOD

(71) Applicant: THALES, Courbevoie (FR)

(72) Inventors: Pascal Cornic, Guilers (FR); Patrick Le Bihan, Lannilis (FR); Joël Fillatre, Noisy-le-Roi (FR)

(73) Assignee: THALES, Courbevoie (FR)

( * ) Notice: Subject to any disclaimer, the term of this patent is extended or adjusted under 35 U.S.C. 154(b) by 101 days.

(21) Appl. No.: 15/524,226

(22) PCT Filed: Sep. 24, 2015

(86) PCT No.: PCT/EP2015/071932
§ 371 (c)(1),
(2) Date: May 3, 2017

(87) PCT Pub. No.: WO2016/074841
PCT Pub. Date: May 19, 2016

(65) Prior Publication Data
US 2017/0336450 A1  Nov. 23, 2017

(30) Foreign Application Priority Data
Nov. 12, 2014  (FR) ..................... 14 02548

(51) Int. Cl.
*G01R 23/167* (2006.01)
*G01S 7/02* (2006.01)
*G01R 23/163* (2006.01)

(52) U.S. Cl.
CPC ......... *G01R 23/167* (2013.01); *G01R 23/163* (2013.01); *G01S 7/021* (2013.01)

(58) Field of Classification Search
CPC ...... G01R 23/167; G01R 23/163; G01S 7/021
See application file for complete search history.

(56) References Cited

U.S. PATENT DOCUMENTS

| 2002/0093342 A1* | 7/2002 | Ivanov | ................... G01R 27/28 324/639 |
| 2006/0195301 A1* | 8/2006 | Mueller | ............... G01R 13/029 702/191 |

(Continued)

FOREIGN PATENT DOCUMENTS

| EP | 2 725 707 A1 | 4/2014 |
| FR | 2 897 441 A1 | 8/2007 |

(Continued)

OTHER PUBLICATIONS

M. Yaghoobi et al., "A low-complexity sub-Nyquist sampling system for wideband Radar ESM receivers," 2014 IEEE International Conference on Acoustics, Speech and Signal Processing, May 2014, pp. 1788-1792, XP032618103.

(Continued)

*Primary Examiner* — Jeff W Natalini
(74) *Attorney, Agent, or Firm* — Baker & Hostetler LLP

(57) ABSTRACT

A digital receiver comprising at least two reception pathways, the method carries out a digital inter-correlation of the signals obtained as output from at least two filters of different central frequencies and different ranks, the rank and the central frequency of the filters being chosen as a function of a determined frequency-wise search domain. For a determined search domain, the various sampling frequencies of the reception pathways are chosen so that the ambiguous frequencies resulting from the spectral aliasings vary as a monotonic function of the true frequency of the signals.

11 Claims, 6 Drawing Sheets

(56) References Cited

U.S. PATENT DOCUMENTS

| | | | | |
|---|---|---|---|---|
| 2007/0109213 A1* | 5/2007 | Takahashi | ............ | H01O 21/062 343/893 |
| 2011/0035168 A1* | 2/2011 | Lelong | ................... | G01R 31/11 702/66 |
| 2014/0225591 A1* | 8/2014 | Knierim | ............. | G01R 13/0272 324/76.23 |
| 2016/0226505 A1* | 8/2016 | Auston | ................ | G01R 23/005 |

FOREIGN PATENT DOCUMENTS

| | | |
|---|---|---|
| FR | 2 939 988 A1 | 6/2010 |
| FR | 3 018 136 A1 | 9/2015 |
| WO | 2004/097450 A1 | 11/2004 |

OTHER PUBLICATIONS

McCormick, "A high resolution, near real-time frequency estimator for sub-microsecond pulses," IEEE International Conference on Systems Engineering, Jan. 1, 1989, pp. 33-38, XP032132227.

\* cited by examiner

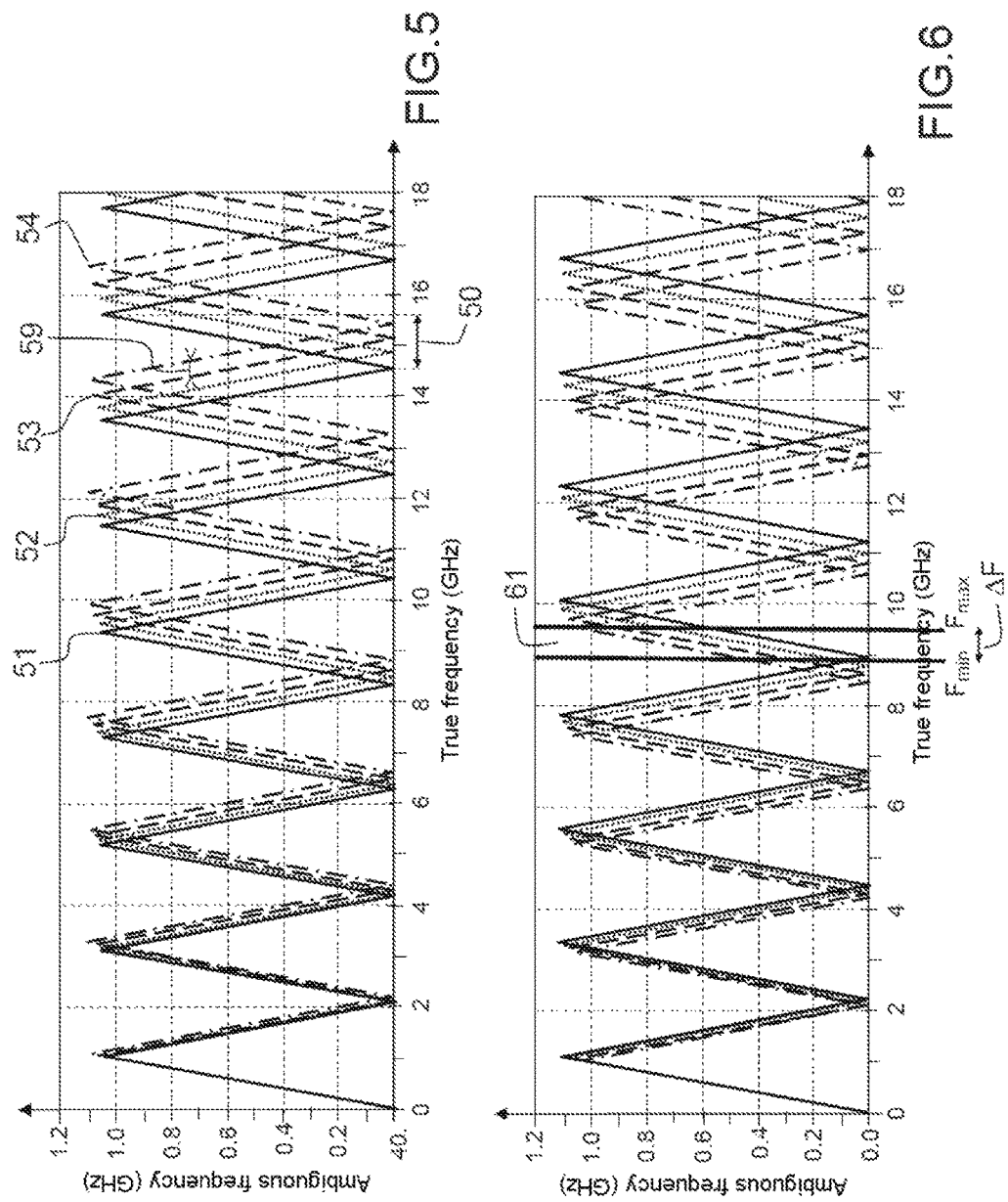

METHOD FOR DETECTING SIGNALS IN A FREQUENCY-AMBIGUOUS DIGITAL RECEIVER, AND DIGITAL RECEIVER IMPLEMENTING SUCH A METHOD

CROSS-REFERENCE TO RELATED APPLICATIONS

This application is a National Stage of International patent application PCT/EP2015/071932, filed on Sep. 24, 2015, which claims priority to foreign French patent application No. FR 1402548, filed on Nov. 12, 2014, the disclosures of which are incorporated by reference in their entirety.

FIELD OF THE INVENTION

The invention relates to a method for detecting signals in a frequency-ambiguous digital receiver. It also relates to a receiver implementing such a method. The invention lies in particular in the field of broadband digital receivers.

BACKGROUND

In certain applications, owing to the technological limitations of analog-digital coding circuits, digital receivers use sampling frequencies that are much lower than the total reception band, for example a sampling frequency of the order of a GHz for a total band to be processed included in a frequency band of the order of about ten Ghz.

Under these conditions the spectral analysis, performed by digital filtering after signal sampling and coding, gives an ambiguous measurement of the frequency of the signal, owing to spectral aliasings.

To process the spectral aliasings resulting from sub-sampling, these receivers use several reception pathways operating at different sampling frequencies. It is then possible to remove the ambiguity in the frequency measurement on the basis of the various frequency measurements obtained on each of the reception pathways, on the condition that the sampling frequencies are chosen judiciously and that the signal-to-noise ratio is sufficient to allow detection of the signal in each reception pathway. Such a device is in particular described in document EP 1 618 407 A1.

In the cases where the signal-to-noise ratio at the output of the filtering is insufficient, the detection and a fortiori the estimation of the frequency of the signal become impossible. Such is the case for example when the signal to be detected results from a continuous or quasi-continuous emission with low peak power.

A problem to be solved is in particular the detection or the measurement of frequency of a signal with long pulse duration and of low peak power on the basis of a digital receiver having broad frequency band and multiple sub-samplings.

SUMMARY OF THE INVENTION

An aim of the invention is in particular to allow the resolution of such a problem.

For this purpose, the subject of the invention is a method for detecting signals in a frequency-ambiguous digital receiver by aliasing of the frequency spectra, said receiver comprising at least two reception pathways, with a sampling frequency for said signals being specific to each pathway, said method comprises at least the following steps:

determining a frequency-wise search band bounded above by a frequency $F_{max}$ which is less than or equal to half the smallest sampling frequency from among the sampling frequencies of said pathways, said search band being contained in one and the same ambiguity rank in relation to the sampling frequencies of said pathways;

determining the sampling frequencies of said pathways in such a way that the aliased frequencies corresponding to said pathways are a monotonic function of the true frequency of said signals in said search band;

digitally filtering said signals in said reception pathways in banks of filters of like central frequency which is a multiple of a quantity $1/T$ and of like width equal to said quantity $1/T$, $Fech_l$ and $Fech_m$ being respectively the sampling frequency of any pathway of order 1 and of any pathway of order m from among said pathways, $Fech_l/L=Fech_m/M=1/T$, L and M being integer numbers;

in said search band, the frequency aliasing of the signal in the pathway of order l giving a response in the filter of rank i and in a pathway of order m a response in the filter of rank k+i or i−k, carrying out a computation of inter-correlation between the signals arising from the filters of rank i of central frequency $Fech_l/L$ of the pathway of order l with at least the signals arising from the filters of rank i+k or i−k of the pathway of order m, of central frequency $(i+k)Fech_m/M$ or $(i-k)Fech_m/M$;

carrying out the detection of the signals by comparing the power of the signal on output from the inter-correlation computation with respect to a given threshold, the frequency of a detected signal being identified by the knowledge of the ranks of said filters.

The sampling frequencies of said pathways are for example determined in such a way that the disparities between the aliased frequencies corresponding to said pathways are constant in said search band.

The frequency-wise search domain is for example displaced by modifying the sampling frequencies of said pathways in the course of time.

Advantageously, said signals can be signals of low peak power and of long pulse duration.

Advantageously, said method can be applied to an amplitude goniometer comprising several antennas, at least two reception pathways being connected to each antenna. For a given antenna, the inter-correlation computation is for example performed between the signals received on the two reception pathways of the antenna, the result of said computation affording access to the amplitude of the signals which is necessary for estimating their direction of arrival. An inter-correlation computation for example is performed between the received signals of two adjacent antennas.

Advantageously, said method can also be applied to a frequency-ambiguous interferometer, a reception pathway being linked to each antenna of said interferometer. Each reception pathway being associated with a different antenna, the relative phase of a signal is extracted on the basis of the various inter-correlation computations performed between the various pathways taken pairwise.

Said method is for example performed in parallel with a detection processing suitable for detecting pulsed signals.

The subject of the invention is also a digital receiver implementing said method.

BRIEF DESCRIPTION OF THE DRAWINGS

Other characteristics and advantages of the invention will become apparent with the aid of the description which follows, given in relation to appended drawings, in which:

FIG. 5 shows an illustration of the variation of the ambiguous frequency obtained by digital spectral aliasing in a receiver;

FIG. 6 shows an illustration of a particular frequency search domain used by the invention;

DETAILED DESCRIPTION

Figure 1:
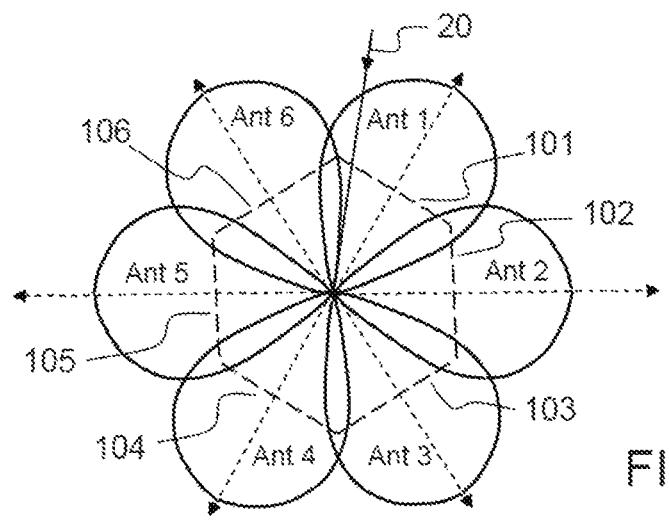
FIGS. 1, 2 and 3 show examples of use of a digital receiver respectively in an amplitude goniometer, in an interferometer and in association with a computational beamforming antenna.
Figure 2:
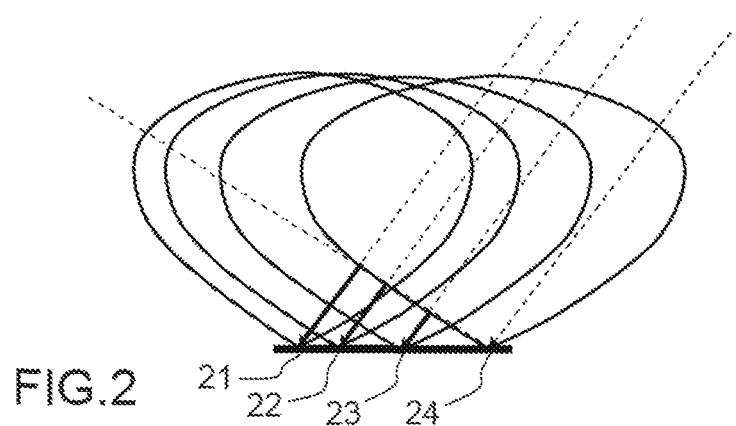
Figure 3:
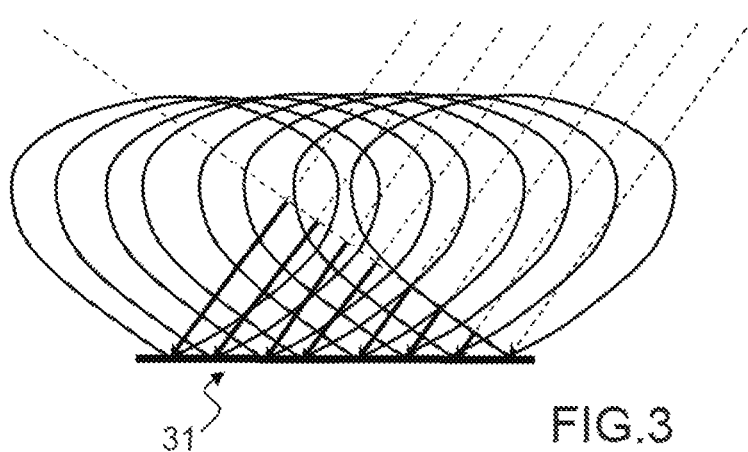

FIGS. 1, 2 and 3 illustrate through basic diagrams examples of use of digital receivers. These receivers can be associated equally well with amplitude goniometry antennas, interferometric antennas or else computational beamforming antennas.

In the case of an array of amplitude goniometry antennas comprising several antennas as illustrated by FIG. 1, a current configuration consists in associating six antennas 101, 102, 103, 104, 105, 106 distributed in a hexagon so as to cover 360° in the horizontal plane, each antenna having an aperture of the order of 60° to 90°. In such a device, the detection of the direction of arrival 20 of a signal is obtained on the basis of the amplitudes received on the various antennas.

In the case of an interferometry antenna as illustrated by FIG. 2, a commonplace configuration consists in using four antennas 21, 22, 23, 24 each covering approximately 90° horizontally, irregularly spaced to form in a given plane an ambiguous interferometric base. A 360° coverage may be obtained for example by using four identical bases of four antennas, the bases being distributed along the sides of a square. In such a device, the direction of arrival of a signal is estimated in each 90° sector by utilizing the phase differences of the signal received on the four antennas of one and the same base.

In the case of a computational beamforming antenna as illustrated by FIG. 3, several antennas 31 generally having an aperture of the order of 90° horizontally are installed in a given plane, the signals received by these various antennas being summed in a coherent manner after digitization so as to simultaneously form several directional beams covering the observation domain. This device also uses the phase of the signal received on the antennas to estimate the direction of arrival, by comparing the amplitude of the signal received in the beams formed in the adjacent directions. This solution is seldom used because of the volume of computations to be performed.

For all these devices in particular, it is necessary to solve the problem of the detection and of the measurement in terms of frequency of the signals of long duration and of low peak power on the basis of a broadband digital receiver with multiple sub-sampling. Currently, the sensitivity of broadband receivers, be they analog or digital, is insufficient to detect these signals of long duration and low peak power.

According to the invention, as will be described subsequently, specific means allowing the detection of the signals of low peak power and of long duration by carrying out an inter-correlation of the received signals sampled at different frequencies are integrated into a broadband digital receiver.

Figure 4:
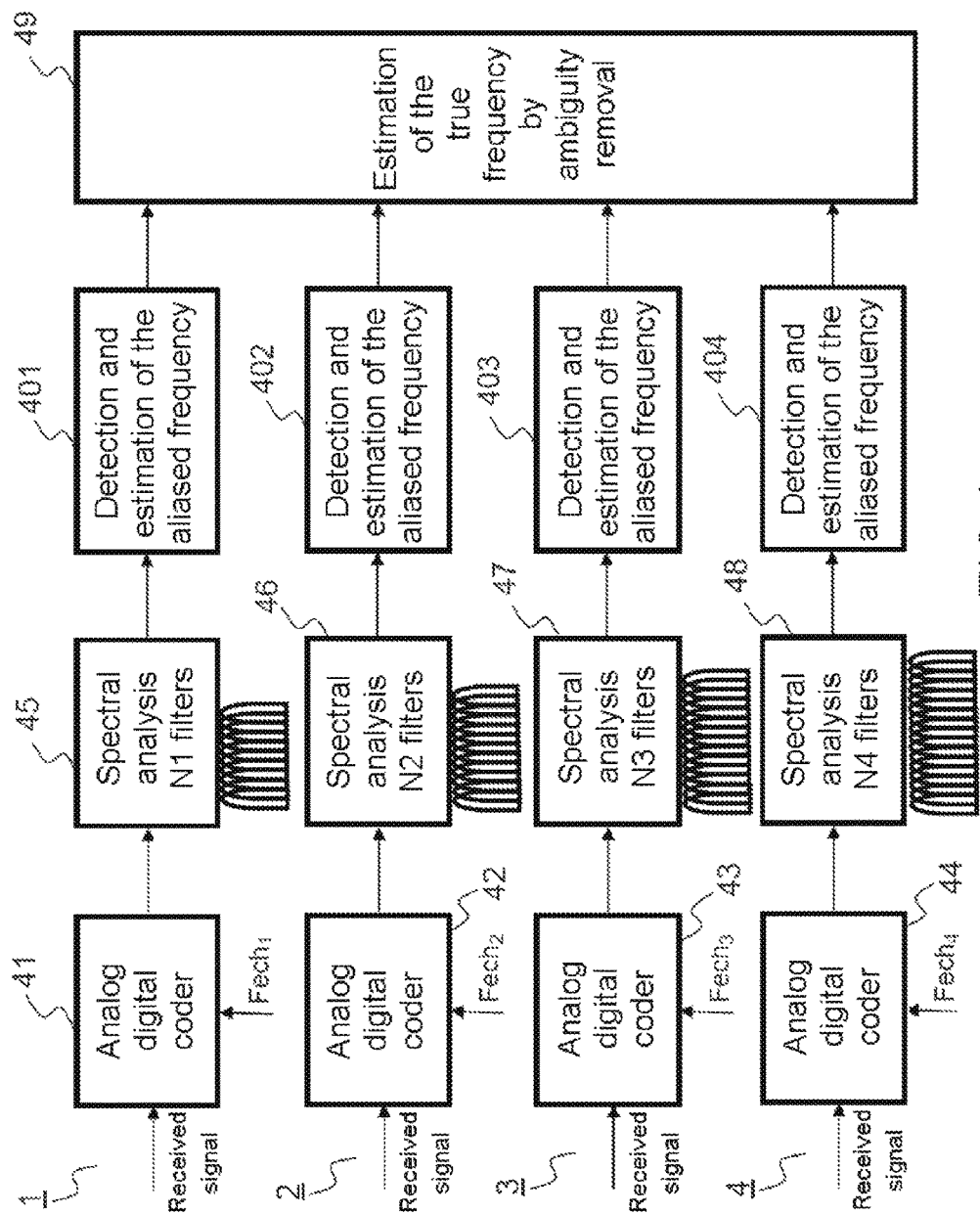
FIG. 4 shows an illustration of the manner of operation of a digital receiver according to the prior art.

FIG. 4 illustrates the operating principle of a digital receiver according to the prior art having a very broad reception band, typically from 2 to 18 GHz. The receiver comprises four reception pathways 1, 2, 3, 4 each having at input an analog-digital coder 41, 42, 43, 44. The four sampling frequencies $Fech_1$, $Fech_2$, $Fech_3$, $Fech_4$ of the coders are different, lying for example between 2 and 3 GHz, thus corresponding to the state of the art for analog coders. The four reception pathways can be linked to antennas which may or may not be different, according to the type of array of antennas that is used.

In such a receiver, the various frequencies $Fech_1$, $Fech_2$, $Fech_3$, $Fech_4$ are chosen so that the ambiguity in the frequency measurement is removed with a sufficient margin of safety in the presence of noise, thus requiring a sufficient spacing between the various frequencies, typically of the order of a few tens of MHz. These various sampling frequencies must also be chosen so that their lowest common multiple is greater than the total analysis band in respect of the received signals. Moreover, because of Shannon's theorem, the instantaneous bandwidth being limited to a value of less than half the lowest sampling frequency, the sampling frequencies must be chosen to be as high as possible. Finally, it is practical to use a constant spacing $\delta F$ between the sampling frequencies since this makes it possible in particular to use simple algorithms to remove the distance-wise ambiguities.

These constraints and facilities lead for example to choosing sampling frequencies as follows, M being an integer number:

$$Fech1 = M\delta F; Fech2 = (M+1)\delta F; Fech3 = (M+2)\delta F; Fech4 = (M+3)\delta F \quad (1)$$

For example, if the sampling frequency of the coders is of the order of 2 GHz, it is possible to choose, by taking M=52:

Fech1=2080 MHz, i.e. 52×40 MHz;
Fech2=2120 MHz, i.e. 53×40 MHz;
Fech3=2160 MHz, i.e. 54×40 MHz;
Fech4=2200 Mhz, i.e. 55×40 MHz.

FIG. 5 illustrates the variation of the ambiguous frequency obtained by digital spectral aliasing as a function of the frequency of the input signal, for each of the four sampling frequencies of the example hereinabove, in a system of axes where the abscissae represent the true frequency of the received signals and the ordinates the ambiguous frequency detected. Four curves 51, 52, 53, 54 represent the ambiguous frequencies as a function of the true frequencies for the four sampling frequencies Fech1, Fech2, Fech3, Fech4.

For each sampling frequency, this ambiguous frequency, forming an aliased frequency, can be written in the following manner:

$$Famb_i = Ftrue - kamb_i \times Fech_i \text{ if } Ftrue > kamb_i \times Fech_i \quad (1)$$

$$Famb_i = kamb_i \times Fech_i - Ftrue \text{ if } Ftrue < kamb_i \times Fech_i \quad (2)$$

where:

Ftrue is the true frequency of the input signal of the receiver;

$Fech_i$ is the sampling frequency on pathway i, i varying from 1 to 4;

$kamb_i$ is the ambiguity rank, corresponding to the integer value of $(Ftrue/Fech_i) + \frac{1}{2}$.

kamb$_i$ is therefore equal to the integer value of (Fs/Fech$_i$)+½, Fs being the frequency of the received signal, at the input of the receiver.

FIG. 5 shows in particular that the frequency measurement obtained after aliasing on the four reception pathways makes it possible to determine without ambiguity the sub-band 50 in which the frequency of the received signal is situated, the disparities between the aliased frequencies being a one-to-one function of the ambiguity rank, more precisely a disparity 59 characterizing a sub-band. Thus, knowing this sub-band 50 and the ambiguous frequency, the true frequency is deduced therefrom.

Returning to FIG. 5, in practice, the spectral analysis 45, 46, 47, 48 may be performed for example by digital Fourier transform (DFT), or else with the aid of polyphase filters. On the basis of the spectral analysis, the detection and the estimation of the aliased frequency is performed 401, 402, 403, 404 on each pathway, followed by the estimation 49 of the true frequency of the received signal by ambiguity removal.

To remove the ambiguity and preserve the relative phase between the pathways 1, 2, 3, 4, the same analysis resolution is used on the various pathways. For example, if a frequency resolution of 10 MHz is desired, it is possible to choose:

For the sampling frequency Fech$_1$=2080 MHz, a DFT on a number of points N1=208

For the sampling frequency Fech$_2$=2120 MHz, a DFT on a number of points N2=212

For the sampling frequency Fech$_3$=2160 MHz, a DFT on a number of points N3=216

For the sampling frequency Fech$_4$=2200 MHz, a DFT on a number of points N4=220 thus corresponding to:

$$\text{Fech}_1/N1=\text{Fech}_2/N2=\text{Fech}_3/N3=\text{Fech}_4/N4=1/T \quad (3)$$

T being the duration of the observation window, 1/T being equal to 10 MHz in this example.

This mode of detection and estimation of the signal frequency as described hereinabove in relation to FIG. 5 is defeated when the signal-to-noise ratio is insufficient to allow detection 401, 402, 403, 404 in each elementary reception pathway.

Moreover, the frequency of the input signal of the receiver being unknown, it is not possible to know the way in which the aliasings 51, 52, 53, 54 are performed and therefore the filters in which the signal is present on the various pathways 1, 2, 3, 4. This prohibits a priori the possibilities of recombining of the received signals between the various pathways aimed at increasing the signal-to-noise ratio, so as to allow detection. Such is the case in particular in the presence of long signals of low peak power.

FIG. 6 illustrates a characteristic of the invention.

According to the invention, on the basis of a determined and limited frequency domain 61 in which it is desired to seek to detect a continuous emission or a long pulse emission of low peak power, the various sampling frequencies are chosen in such a way that the disparities between aliased frequencies corresponding to the various reception pathways 1, 2, 3, 4 are constant in this determined frequency domain 61.

This is obtained, if:

Firstly, the ambiguity rank of the frequency obtained after aliasing is identical for all the sampling frequencies inside the frequency search domain. Stated otherwise, the search domain 61 is contained in one and the same ambiguity rank in relation to the sampling frequencies of the various pathways. In the example of FIG. 6, we must have:

kamb$_1$=kamb$_2$=kamb$_3$=kamb$_4$=kamb, i.e.:

integer value (Ftrue/Fech$_1$)=integer value (Ftrue/Fech$_2$)=integer value (Ftrue/Fech$_3$)=integer value (Ftrue/Fech$_4$)

Secondly, in the interval corresponding to the frequency search domain, if the ambiguous frequency is a monotonic function of the true frequency of like direction of variation for the various sampling frequencies.

For any true frequency value, Ftrue, contained in the frequency domain 61 defined by bounds F$_{min}$, F$_{max}$, we then have:

For an increasing direction of variation, that is to say for the integer values of kamb:

F$_{min}$≥kamb×Fech$_{max}$ and F$_{max}$<(kamb+½)×Fech$_{min}$

For a decreasing direction of variation:

F$_{min}$≥(kamb+½)×Fech$_{max}$ and F$_{max}$<(kamb+1)×Fech$_{min}$.

Fech$_{min}$ is the smallest of the sampling frequencies of the various pathways. In the present example, Fech$_{min}$ is Fech$_1$. Likewise, Fech$_{max}$ is the largest of the sampling frequencies and Fech$_{max}$ is Fech$_4$.

For example, by choosing the increasing direction of variation of the ambiguous frequency, it is possible to choose:

$$\text{Fech}_{max} \geq F_{min}/\text{kamb}.$$

For a frequency domain 61 limited to ΔF, it follows that:

$$\Delta F \leq F_{max} - F_{min}, \text{ i.e.:}$$

$$\Delta F \leq \text{kamb} \times (\text{Fech}_{min} - \text{Fech}_{max}) + \text{Fech}_{min}/2.$$

And by using relationship (3), we obtain for four sampling frequencies:

$$\Delta F \leq \left(\frac{M}{2} - 3\text{kamb}\right)\delta F.$$

For example, if the low bound of the search domain is fixed at $$F_{min}=9 \text{ GHz,}$$

it is possible to choose, having regard to the maximum accessible sampling frequencies of the order of 2 GHz, by taking as sampling frequency step size δF=40 MHz:

Kamb=4

Fech$_4$=Fech$_{max}$=(M+3)δF the integer nearest to F$_{min}$/Kamb=2.25 GHz, i.e. 56×40 MHz=2.24 GHz with:

M+3=56, i.e. M=53.

Hence:

Fech$_3$=55×40 MHz=2.2 GHz;

Fech$_2$=54×40 MHz=2.16 GHz;

Fech$_1$=53×40 MHz=2.12 GHz.

And for a frequency search domain bounded by ΔF≤580 MHz, we obtain F$_{max}$=9.58 GHz.

After having fixed the sampling frequencies in accordance with the foregoing, the disparity of the aliased frequencies between the various reception pathways 1, 2, 3, 4 in the search domain 61 is determined in a following step.

Figure 7:
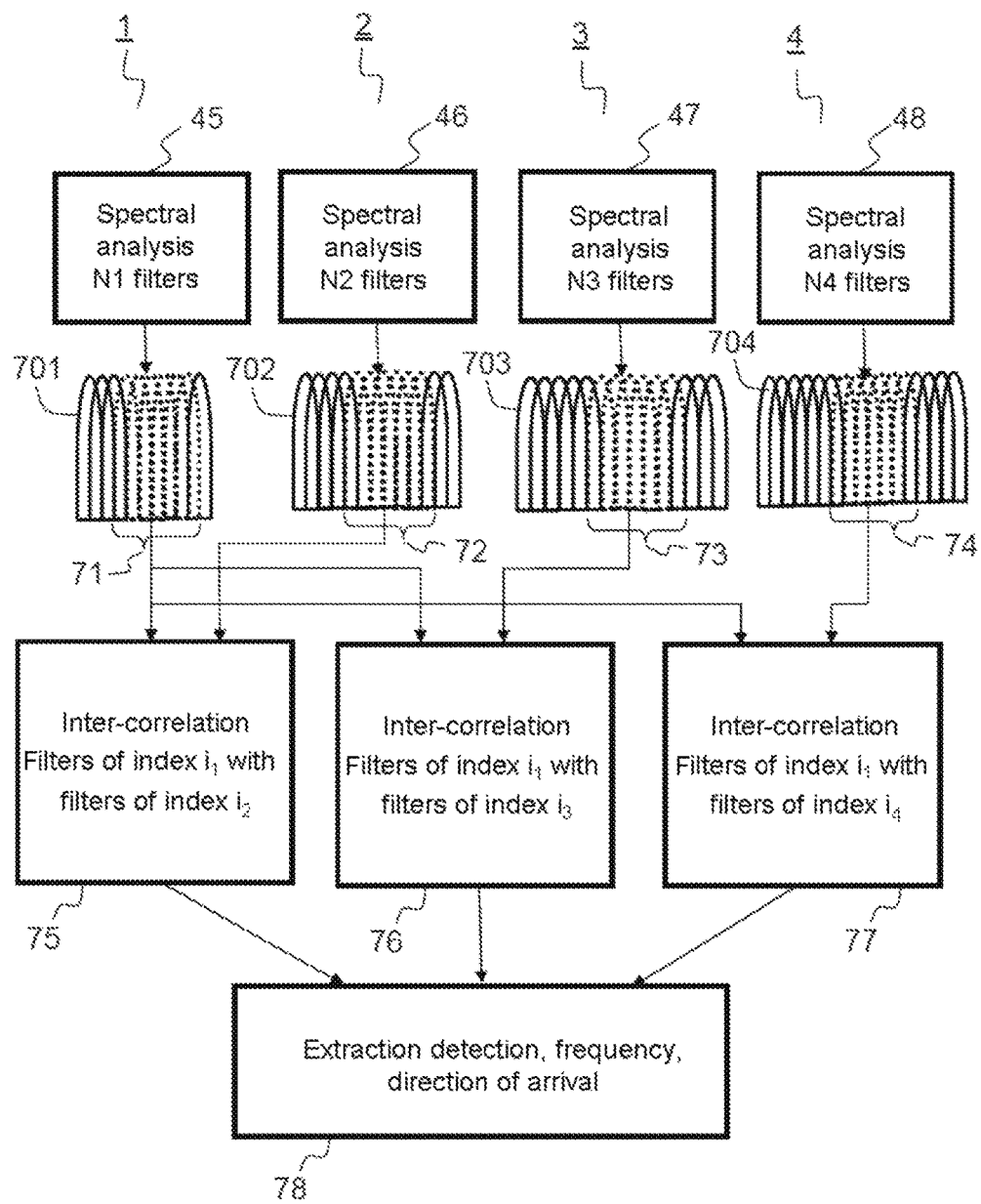
FIG. 7 shows an illustration of the operating principle of a receiver implementing the detection method according to the invention.

In this domain 61, and as illustrated by FIG. 6, by retaining only the assumption of the monotonic increasing aliased frequency, we obtain:

Ftrue=kamb $Fech_1+i_1$ $Fech_1/N1$
Ftrue=kamb $Fech_2+i_2$ $Fech_2/N2$
Ftrue=kamb $Fech_3+i_3$ $Fech_3/N3$
Ftrue=kamb $Fech_4+i_4$ $Fech_4/N4$ where $i_1$, $i_2$, $i_3$, $i_4$ represent the indices, or the ranks, of the filters 71, 72, 73, 74 of the pathways 1, 2, 3, 4 respectively, in which the input signal is aliased, N1, N2, N3, N4 having been defined previously. These filters are illustrated in the diagram of FIG. 7 presenting these four pathways. These filters 71, 72, 73, 74 are contained in banks of filters 701, 702, 703, 704. The spectral analysis can be obtained via a direct Fourier transform (DFT) or via polyphase filters. Stated otherwise, the banks of filters can be of the DFT or polyphase type for example.

According to relationship (3) specifying that:

$$Fech_1/N1 = Fech_2/N2 = Fech_3/N3 = Fech_4/N4 = 1/T$$

it follows that:

$$i_2 - i_1 = -kamb \cdot \delta F \cdot T$$

$$i_3 - i_1 = -2 kamb \cdot \delta F \cdot T$$

$$i_4 - i_1 = -3 kamb \cdot \delta F \cdot T.$$

For example, for the above example, if the spectral analysis resolution is fixed at 10 MHz, corresponding to T=100 ns, for kamb=4 and $\delta F$=40 MHz:

$$i_2 - i_1 = -16$$

$$i_3 - i_1 = -32$$

$$i_4 - i_1 = -48.$$

Knowing the rank $i_1$ involved in the first bank of filters 701, the ranks $i_2$, $i_3$, $i_4$ of the filters involved in the other banks 702, 703, 704 are deduced therefrom.

Having thus identified the differences of index of the filters involved 71, 72, 73, 74, a following step consists in performing complex inter-correlations 75, 76, 77 of the signals arising from these filters between the various pathways.

This inter-correlation is performed over a long time, typically of the order of 100 microseconds, in accordance with the type of inter-correlation described for example in patent application FR 1400514.

It makes it possible not only to obtain a sufficient signal-to-noise ratio for detection, but also to extract the phase difference between the reception pathways, for example in the case of an interferometer, or else the amplitude difference between two adjacent antennas, in the case of an amplitude goniometer.

In this process, the output of the filter of index $i_1$ of pathway 1 will be correlated with the output of the filter of index $i_2$ of pathway 2 and for example, for 4 reception pathways, the output of the filter of pathway 1 will also be correlated with the output of the filter $i_3$ of pathway 3 and $i_4$ of pathway 4, as illustrated by the example of FIG. 7.

This process is performed for all the indices of filters whose central frequencies are contained in the search domain.

In a following step 78, the results of the inter-correlations are thereafter compared in terms of amplitude with a threshold so as to ensure detection of the signals and identify the indices of the filters corresponding to the signal so as to estimate the frequency thereof. The amplitude and the phase of the inter-correlations are also stored at this level, for example so as to extract the direction of arrival of the signal.

After having thus utilized a search domain 61, it is thus possible to choose a new domain by defining a new set of sampling frequencies.

The invention has been described by way of example in respect of a digital receiver with four pathways. It applies more generally in respect of a receiver comprising at least two different pathways corresponding to different sampling frequencies $Fech_l$, $Fech_m$ in banks of filters 701, 702, 703, 704 of like central frequency which is a multiple of a quantity 1/T, where $1/T = Fech_l/L = Fech_m/L$, and of like widths $1/T = Fech_l/L = Fech_m/L$, L and M being integer numbers, T being the duration of the observation window.

Advantageously, the invention can in particular be applied to an interferometer or to a receiver with amplitude goniometry.

Figure 8:
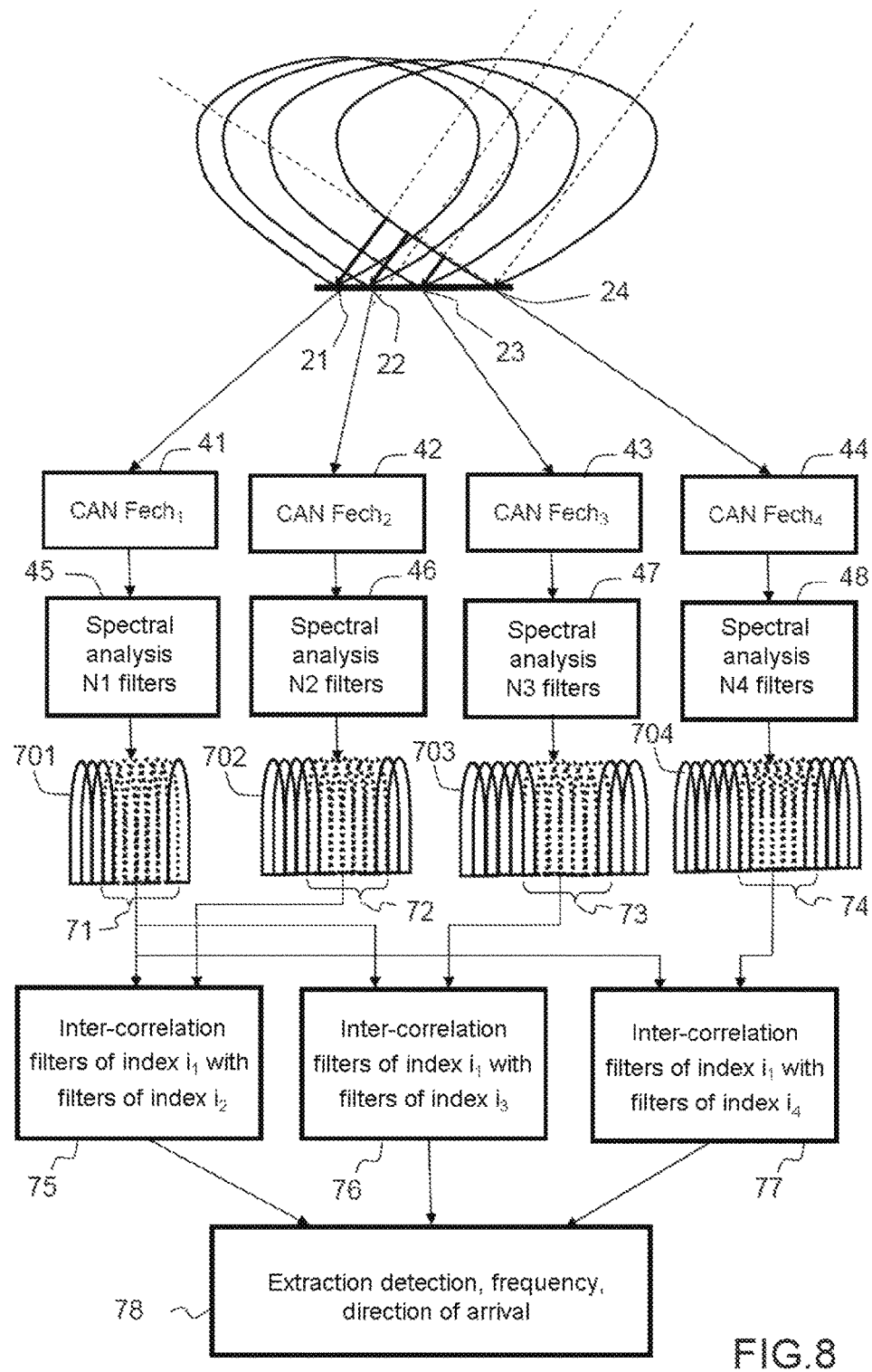
FIG. 8 shows an exemplary application of the invention to an interferometer.

FIG. 8 illustrates the application to an interferometer. The system illustrated by FIG. 7 is connected, in terms of reception, to the antennas 21, 22, 23, 24 of the device of FIG. 2. More precisely, coders 41, 42, 43, 44 each receive as input a signal arising from an antenna 21, 22, 23, 24, optionally via an interface which is not shown. In accordance with the above description, a first coder 41 samples at the frequency $Fech_1$, a second coder at the frequency $Fech_2$, a third coder at the frequency $Fech_3$ and a fourth coder at the frequency $Fech_4$, the frequencies preferably being different.

The digital signals arising from the coders are thereafter processed in accordance with the method according to the invention, as output from spectral analyses 45, 46, 47, 48. The inter-correlation as described hereinabove is performed in particular between the received signal of the first antenna 21 with the received signals of the other antennas 22, 23, 24, the filter of index being associated with the first reception pathway linked to the first antenna 21. Stated otherwise, each reception pathway, of different sampling frequency, being associated with a different antenna, the relative phase of the signals is extracted on the basis of the various inter-correlation computations performed between the various pathways taken pairwise. The direction of arrival of the signals is obtained with the aid of this phase.

The removals of ambiguity of the frequency measurement and of the interferometry phase measurement are thus performed in a single operation resulting from the inter-correlation products, as is described in relation to FIG. 7.

Figure 9:
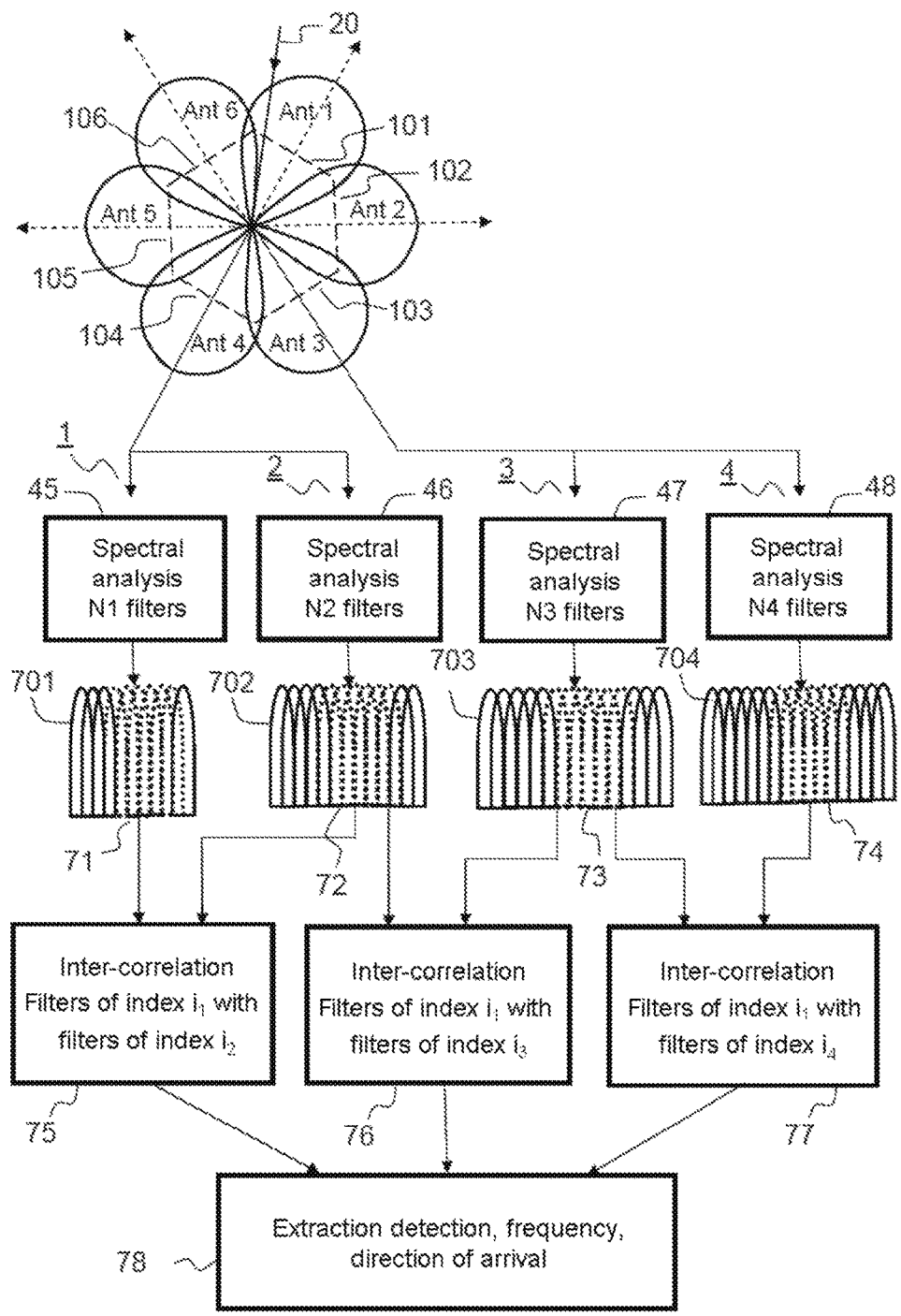
FIG. 9 shows an exemplary application of the invention to an amplitude goniometer.

FIG. 9 illustrates the application to an amplitude goniometer as illustrated by FIG. 1. In a particular embodiment, at least two reception pathways 1, 2 operating at two sampling frequencies are connected to each antenna 101, 102, 103, 104, 105, 106. For the sake of clarity, in FIG. 9, only two antennas 103, 104 are linked to reception pathways, each being linked to two reception pathways.

On a given antenna 104, the inter-correlation is performed on two pathways 1, 2 of different sampling frequencies. This inter-correlation computation affords access to the measurement of amplitude of the signal necessary for estimating the direction of arrival. The removal of ambiguity in the frequency measurement is for example performed with the aid of the frequency-aliased signals obtained on the basis of the same signal sampled with the aid of two different frequency pairs. This signal may originate from one and the same antenna 104, or two adjacent antennas 103, 104 receiving it simultaneously. Coverage over 360° is obtained with the aid of 12 reception pathways for a goniometric device with 6 antennas, each antenna being linked to two pathways.

The invention claimed is:

1. A method for detecting signals in a frequency-ambiguous digital receiver by aliasing of the frequency spectra, said receiver comprising at least two reception pathways, wherein, with a sampling frequency for said signals being specific to each pathway, said method comprises:
   determining a frequency-wise search band having a maximum frequency, which is less than or equal to half the smallest sampling frequency from among the sampling frequencies of said pathways, said sampling frequencies of said pathways inside said search band having the same ambiguity rank;
   determining the sampling frequencies of said pathways such that the aliased frequencies, which correspond to said pathways, vary as a monotonic function of the true frequency of said signals in said search band;
   digitally filtering said signals in said reception pathways in banks of filters that each have (i) the same central frequency, which is a multiple of a quantity $1/T$, and (ii) the same width, which is equal to said quantity $1/T$, $Fech_l$ and $Fech_m$ being respectively the sampling frequency of any pathway of order 1 and of any pathway of order m, $Fech_l/L = Fech_m/M = 1/T$, L and M being integers, wherein at least one of the at least two reception pathways is of the order 1, wherein at least one of the at least two reception pathways is of the order m, and wherein T is a duration of an observation window;
   in said search band, the frequency aliasing of the signal in the at least one pathway of the order 1 giving a response in the filter of rank i, and the frequency aliasing of the signal in the at least one pathway of the order m giving a response in the filter of rank k+i or i−k, carrying out a computation of inter-correlation between (i) the signal arising from the filter of rank i of central frequency $Fech_l/L$ of the at least one pathway of the order 1 and (ii) at least the signal arising from the filter of rank i+k or i−k of the at least one pathway of the order m, of central frequency $(i+k)Fech_m/M$ or $(i-k)Fech_m/M$, i and k being integers; and
   carrying out the detection of the signals by comparing a power of the signal on output from the inter-correlation computation to a threshold.

2. The method as claimed in claim 1, wherein disparities, between the aliased frequencies corresponding to said pathways, are constant in said search band.

3. The method as claimed in claim 1, further comprising:
   displacing said frequency-wise search band by modifying the sampling frequencies of said pathways.

4. The method as claimed in claim 1, wherein said signals are signals of low peak power and of long pulse duration.

5. The method as claimed in claim 1, wherein at least two of the at least two reception pathways are connected to each antenna of an amplitude goniometer, the amplitude goniometer comprising several antennas.

6. The method as claimed in claim 5, further comprising:
   receiving the signals on the two reception pathways of the antenna; and
   performing, for a given antenna, the inter-correlation computation between the received signals, a result of said computation affording access to an amplitude of the signals, which is necessary for estimating their direction of arrival.

7. The method as claimed in claim 5, further comprising:
   receiving signals of two adjacent antennas; and
   performing an inter-correlation computation between the received signals.

8. The method as claimed in claim 1, wherein one of the at least two reception pathways is linked to each antenna of a frequency-ambiguous interferometer.

9. The method as claimed in claim 8, further comprising:
   extracting a relative phase of a signal based on a plurality of inter-correlation computations performed between a plurality of pathways taken pairwise,
   wherein each reception pathway is associated with a different antenna.

10. The method as claimed in claim 1, further comprising:
    detecting, in parallel with the determination of the frequency-wise search band, the determinations of the sampling frequencies, the digital filtering of said signals, and the computation of the inter-correlation, pulsed signals.

11. A digital receiver, comprising at least two reception pathways, wherein the digital receiver is configured to execute the method as claimed in claim 1.

* * * * *